United States Patent
Yamazaki

(10) Patent No.: US 8,980,686 B2
(45) Date of Patent: Mar. 17, 2015

(54) SPUTTERING TARGET AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/474,365

(22) Filed: Sep. 2, 2014

(65) Prior Publication Data

US 2014/0370653 A1 Dec. 18, 2014

Related U.S. Application Data

(63) Continuation of application No. 13/221,252, filed on Aug. 30, 2011, now Pat. No. 8,835,214.

(30) Foreign Application Priority Data

Sep. 3, 2010 (JP) .................... 2010-197509

(51) Int. Cl.
*H01L 21/00* (2006.01)
*H01L 21/02* (2006.01)
*H01L 29/66* (2006.01)
*H01L 29/786* (2006.01)

(52) U.S. Cl.
CPC .... *H01L 21/02631* (2013.01); *H01L 29/66969* (2013.01); *H01L 21/02565* (2013.01); *H01L 29/7869* (2013.01)
USPC .............. 438/104; 438/85; 438/722; 257/43; 257/E29.1; 257/E29.296; 257/E21.296; 257/E21.291; 257/E21.462

(58) Field of Classification Search
None
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 6,294,274 B1 | 9/2001 | Kawazoe et al. |

(Continued)

FOREIGN PATENT DOCUMENTS

| CN | 101680081 A | 3/2010 |
| EP | 1737044 A | 12/2006 |

(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.

(Continued)

*Primary Examiner* — Yasser A Abdelaziez
(74) *Attorney, Agent, or Firm* — Fish & Richardson P.C.

(57) ABSTRACT

An object is to provide a deposition technique for depositing an oxide semiconductor film. Another object is to provide a method for manufacturing a highly reliable semiconductor element using the oxide semiconductor film. A novel sputtering target obtained by removing an alkali metal, an alkaline earth metal, and hydrogen that are impurities in a sputtering target used for deposition is used, whereby an oxide semiconductor film containing a small amount of those impurities can be deposited.

19 Claims, 3 Drawing Sheets

(56) References Cited

U.S. PATENT DOCUMENTS

| | | |
|---|---|---|
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,510,635 B2 | 3/2009 | Shindo et al. |
| 7,674,650 B2 | 3/2010 | Akimoto et al. |
| 7,732,819 B2 | 6/2010 | Akimoto et al. |
| 8,202,365 B2 | 6/2012 | Umeda et al. |
| 8,274,078 B2 | 9/2012 | Itagaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0098626 A1 | 5/2007 | Shindo et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0301328 A1 | 12/2010 | Yamazaki et al. |
| 2010/0320458 A1 | 12/2010 | Umeda et al. |
| 2010/0320459 A1 | 12/2010 | Umeda et al. |
| 2011/0062436 A1 | 3/2011 | Yamazaki et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-256838 A | 9/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-167095 A | 7/2009 |
| JP | 2009-275272 A | 11/2009 |
| JP | 2010-018457 A | 1/2010 |
| JP | 4415062 | 2/2010 |
| JP | 2010-070418 A | 4/2010 |
| JP | 2010-177431 A | 8/2010 |
| JP | 4571221 | 10/2010 |
| KR | 2006-0056399 A | 5/2006 |
| KR | 2007-0087226 A | 8/2007 |
| KR | 2009-0122391 A | 11/2009 |
| WO | WO-2004/114391 | 12/2004 |
| WO | WO-2005/033355 | 4/2005 |
| WO | WO-2008/114588 | 9/2008 |
| WO | WO-2008/133345 | 11/2008 |

OTHER PUBLICATIONS

Kim.S et al., "High-Performance oxide thin film transistors passivated by various gas plasmas", 214TH ECS Meeting, 2008, No. 2317, ECS.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

(56) References Cited

OTHER PUBLICATIONS

Fung.T et al., "2-D Numerical Simulation of High Performance Amorphous In—Ga—Zn—O TFTs for Flat Panel Displays", AM-FPD '08 Digest of Technical papers, Jul. 2, 2008, pp. 251-252, The Japan Society of Applied Physics.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Janotti.A et al., "Oxygen Vacancies in ZnO", Appl. Phys. Lett. (Applied Physics Letters), 2005, vol. 87, pp. 122102-1-122102-3.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Lee.H et al., "Current Status of, Challenges to, and Perspective View of AM-OLED ", IDW '06 : Proceedings of the 13th International Display Workshops, Dec. 7, 2006, pp. 663-666.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Mo.Y et al., "Amorphous Oxide TFT Backplanes for Large Size AMOLED Displays", IDW '08 : Proceedings of the 6th International Display Workshops, Dec. 3, 2008, pp. 581-584.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Park.J et al., "High performance amorphous oxide thin film transistors with self-aligned top-gate structure", IEDM 09: Technical Digest of International Electron Devices Meeting, Dec. 7, 2009, pp. 191-194.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Park.S et al., "Challenge to Future Displays: Transparent AM-OLED Driven by Peald Grown ZNO TFT", IMID '07 Digest, 2007, pp. 1249-1252.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Park.J et al., "Dry etching of ZnO films and plasma-induced damage to optical properties", J. Vac. Sci. Technol. B (Journal fo Vacuum Science & Technology B), Mar. 1, 2003, vol. 21, pp. 800-803.

Asakuma.N. et al., "Crystallization and Reduction of Sol-Gel-Derived Zinc Oxide Films by Irradiation With ultraviolet lamp", Journal of Sol-Gel Science and Technology, 2003, vol. 26, pp. 181-184.

Kimizuka.N. et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu,orZn] at Temperatures Over 1000° C", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kurokawa.Y et al., "UHF RFCPUS on Flexible and Glass Substrates for Secure RFID Systems", Journal of Solid-State Circuits , 2008, vol. 43, No. 1, pp. 292-299.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Kitzerow.H et al., "Observation of Blue Phases in Chiral Networks", Liquid Crystals, 1993, vol. 14, No. 3, pp. 911-916.

Nomura.K et al., "Room-Temperature Fabrication of Transparent Flexible Thin-Film transistors using Amorphous Oxide Semiconductors", Nature, Nov. 25, 2004, vol. 432, pp. 488-492.

Kikuchi.H et al., "Polymer-Stabilized Liquid Crystal Blue Phases", Nature Materials, Sep. 2, 2002, vol. 1, pp. 64-68.

Nakamura.M, "Synthesis of Homologous Compound with New Long-Period Structure", NIRIM Newsletter, Mar. 1, 1995, vol. 150, pp. 1-4.

Orita.M et al., "Amorphous transparent conductive oxide InGaO3(ZnO)m (m <4):a Zn4s conductor", Philosophical Magazine, 2001, vol. 81, No. 5, pp. 501-515.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Oba.F et al., "Defect energetics in ZnO: A hybrid Hartree-Fock density functional study", Phys. Rev. B. (Physical Review. B), 2008, vol. 77, pp. 245202-1-245202-6.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Janotti.A et al., "Native Point Defects in ZnO", Phys. Rev. B (Physical Review. B), Oct. 4, 2007, vol. 76, No. 16, pp. 165202-1-165202-22.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Meiboom.S et al., "Theory of the Blue Phase of Cholesteric Liquid Crystals", Phys. Rev. Lett. (Physical review Letters), May 4, 1981, vol. 46, No. 18, pp. 1216-1219.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Hosono.H, "68.3:Invited Paper:Transparent Amorphous Oxide Semiconductors for High Performance TFT", SID Digest '07 SID International Symposium Digest of Technocal papers, 2007, vol. 38, pp. 1830-1833.

Miyasaka.M, "SUFTLA Flexible Microelectronics on Their Way to Business", SID Digest '07 : SID International Symposium Digest of Technocal papers, 2007, vol. 68, pp. 1673-1676.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Jeong.J et al., "3.1: Distinguished Paper: 12.1-Inch WXGA AMOLED Display Driven by Indium—Gallium—Zinc Oxide TFT Array", SID Digest '08 : SID International Symposium Digest of Technical Papers, May 20, 2008, vol. 39, No. 1, pp. 1-4.

Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Hayashi.R et al., "42.1: Invited Paper: Improved Amorphous In—Ga—Zn—O TFTS", SID Digest '08 : SID International Symposium Digest of Technical papers, May 20, 2008, vol. 39, pp. 621-624.

Hsieh.H et al., "P-29:Modeling of Amorphous Oxide Semiconductor Thin Film Transistors and Subgap Density of States", SID Digest '08 : SID International Symposium Digest of Technical papers, May 20, 2008, vol. 39, pp. 1277-1280.

Lee.J et al., "World'S Largest (15-Inch) XGA AMCLD Panel Using IGZO Oxide TFT", SID Digest '08 : SID International Symposium Digest of Technical papers, May 20, 2008, vol. 39, pp. 625-628.

Ohara.H et al., "21.3:4.0 In. QVGA AMOLED Display Using In—Ga—Zn—Oxide TFTS With a Novel Passivation Layer", SID Digest '09 : SID International Symposium Digest of Technical papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Kikuchi.H et al., "39.1:Invited Paper:Optically Isotropic Nano-Structured Liquid Crystal Composites for Display Applications", SID Digest '09 : SID International Symposium Digest of Technical papers, May 31, 2009, pp. 578-581.

Cho.D et al., "21.2:Al and SN-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide—Based Thin-Film Transistors by DC Sputtering", SID Digest '09 : SID International Symposium Digest of Technical Papers, May 31, 2009, pp. 191-193.

Nowatari.H et al., "60.2: Intermediate Connector With Suppressed Voltage Loss for White Tandem OLEDS", SID Digest '09 : SID International Symposium Digest of Technical papers, May 31, 2009, vol. 40, pp. 899-902.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Clark.S et al., "First Principles Methods Using CASTEP", Zeitschrift fur Kristallographie, 2005, vol. 220, pp. 567-570.

International Search Report (Application No. PCT/JP2011/069100) Dated Nov. 8, 2011.

Written Opinion (Application No. PCT/JP2011/069100) Dated Nov. 8, 2011.

Van De Walle.C et al., "Hydrogen in Semiconductors", 2006, vol. 36, pp. 179-198, Annual Review of Materials Research.

ations filed in Japan as Serial No. 2010-197509 on Sep. 3, 2010, both of which are incorporated by reference.

SPUTTERING TARGET AND METHOD FOR MANUFACTURING SEMICONDUCTOR DEVICE

CROSS-REFERENCE TO RELATED APPLICATIONS

This application is a continuation of U.S. application Ser. No. 13/221,252, filed Aug. 30, 2011, now allowed, which claims the benefit of a foreign priority application filed in Japan as Serial No. 2010-197509 on Sep. 3, 2010, both of which are incorporated by reference.

TECHNICAL FIELD

The present invention relates to a sputtering target and a method for manufacturing the sputtering target. Further, the present invention relates to a method for manufacturing a semiconductor device which is manufactured with the use of the sputtering target and uses an oxide semiconductor.

In this specification, a semiconductor device means a general device which can function by utilizing semiconductor characteristics, and an electro-optic device, a semiconductor circuit, and an electronic device are all semiconductor devices.

BACKGROUND ART

A transistor formed over a flat plate such as a glass substrate, which is typically used in a liquid crystal display device, is generally formed using a semiconductor material such as amorphous silicon or polycrystalline silicon. A transistor manufactured using amorphous silicon has low field effect mobility, but can be formed over a larger glass substrate. In contrast, a transistor manufactured using polycrystalline silicon has high field effect mobility, but needs a crystallization step such as laser annealing and is not always suitable for a larger glass substrate.

Thus, a technique in which a transistor is manufactured using an oxide semiconductor as a semiconductor material and applied to an electronic device or an optical device has attracted attention. For example, Patent Document 1 and Patent Document 2 disclose a technique by which a transistor is formed using zinc oxide or an In—Ga—Zn-based oxide semiconductor as a semiconductor material and such a transistor is used as a switching element or the like of an image display device.

A transistor in which a channel formation region (also referred to as a channel region) is provided in an oxide semiconductor can have higher field effect mobility than a transistor using amorphous silicon. An oxide semiconductor film can be formed by a sputtering method or the like at a relatively low temperature. Its manufacturing process is easier than that of a transistor using polycrystalline silicon.

Transistors which are formed using such an oxide semiconductor over a glass substrate, a plastic substrate, or the like are expected to be applied to display devices such as a liquid crystal display, an electroluminescent display (also referred to as an EL display), and electronic paper.

REFERENCE

[Patent Document 1] Japanese Published Patent Application No. 2007-123861
[Patent Document 2] Japanese Published Patent Application No. 2007-96055

DISCLOSURE OF INVENTION

However, characteristics of a semiconductor element which is manufactured using an oxide semiconductor are not yet sufficient. For example, controlled threshold voltage, high operation speed, and sufficient reliability are required for a transistor including an oxide semiconductor film.

An object of one embodiment of the present invention is to provide a deposition technique for forming an oxide semiconductor film. In addition, an object of one embodiment of the present invention is to provide a method for manufacturing a highly reliable semiconductor element using the oxide semiconductor film.

The density of carriers in an oxide semiconductor film has influence on the threshold voltage of a transistor including the oxide semiconductor. The carriers in the oxide semiconductor film are generated due to impurities contained in the oxide semiconductor film. For example, impurities such as a compound containing a hydrogen atom typified by $H_2O$, a compound containing an alkali metal, or a compound containing an alkaline earth metal contained in the deposited oxide semiconductor film increase the carrier density of the oxide semiconductor film.

In order to achieve the above objects, impurities contained in the oxide semiconductor film which have influence on the carrier density, for example, a compound containing a hydrogen atom typified by $H_2O$, a compound containing an alkali metal, or a compound containing an alkaline earth metal may be removed. Specifically, a novel sputtering target obtained by removing an alkali metal, an alkaline earth metal, and hydrogen that are impurities in a sputtering target used for deposition is used, whereby an oxide semiconductor film containing a small amount of those impurities can be deposited.

A sputtering target of one embodiment of the present invention is a sputtering target for forming an oxide semiconductor film and includes a sintered body of at least one oxide selected from zinc oxide, aluminum oxide, gallium oxide, indium oxide, and tin oxide. When observed by SIMS, the concentration of each of alkali metals contained in the sintered body is $5 \times 10^{16}$ $cm^{-3}$ or lower. Further, when observed by SIMS, the concentration of hydrogen contained in the sintered body is $1 \times 10^{19}$ $cm^{-3}$ or lower, preferably $1 \times 10^{18}$ $cm^{-3}$ or lower, more preferably lower than $1 \times 10^{16}$ $cm^{-3}$.

More specifically, the concentration of sodium (Na) observed by SIMS is $5 \times 10^{16}$ $cm^{-3}$ or lower, preferably $1 \times 10^{16}$ $cm^{-3}$ or lower, more preferably $1 \times 10^{15}$ $cm^{-3}$ or lower. The concentration of lithium (Li) observed by SIMS is $5 \times 10^{15}$ $cm^{-3}$ or lower, preferably $1 \times 10^{15}$ $cm^{-3}$ or lower. The concentration of potassium (K) observed by SIMS is $5 \times 10^{15}$ $cm^{-3}$ or lower, preferably $1 \times 10^{15}$ $cm^{-3}$ or lower.

It has been pointed out that an oxide semiconductor is insensitive to impurities, there is no problem when a considerable amount of metal impurities is contained in the film, and therefore, soda-lime glass which contains a large amount of an alkali metal such as sodium and is inexpensive can also be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). But such consideration is not appropriate.

An alkali metal and an alkaline earth metal are adverse impurities for a transistor using an oxide semiconductor layer and are preferably contained as little as possible. An alkali metal, in particular, Na diffuses into an oxide and becomes $Na^+$ when an insulating film in contact with the oxide semiconductor layer is an oxide. In addition, Na cuts a bond between metal and oxygen or enters the bond in the oxide semiconductor layer. As a result, transistor characteristics deteriorate (e.g., the transistor becomes normally-on (the shift of threshold voltage to a negative side) or the mobility is decreased). In addition, this also causes variation in the characteristics. Such a problem is significant especially in the case where the hydrogen concentration in the oxide semiconductor layer is sufficiently low. Thus, the concentration of an alkali metal is required to be set to the above value in the case where the concentration of hydrogen in the oxide semiconductor layer is $5\times10^{19}$ cm$^{-3}$ or lower, particularly $5\times10^{18}$ cm$^{-3}$ or lower.

Note that in this specification, a measurement value obtained by secondary ion mass spectrometry (SIMS) is used as the impurity concentration in the sputtering target or the oxide semiconductor film. It is known that it is difficult to obtain accurate data in the proximity of a surface of a sample or in the proximity of an interface between stacked films formed using different materials by the SIMS analysis in principle. Thus, in the case where distributions of the impurity concentrations in the films in thickness directions are analyzed by SIMS, the smallest value in a region where the films are provided, the value is not greatly changed, and almost constant level of strength can be obtained is employed as the impurity concentration. Further, in the case where the thickness of the film is small, a region where almost constant level of strength can be obtained cannot be found in some cases due to the influence of the impurity concentration in the films adjacent to each other. In this case, the smallest value of the impurity concentration in a region where the films are provided is employed as the impurity concentration in the film.

In one embodiment of the present invention, a sputtering target containing a small amount of impurities such as a hydrogen atom, an alkali metal, and an alkaline earth metal can be provided. An oxide semiconductor film in which impurities are reduced can be formed using the sputtering target. A method for manufacturing a highly reliable semiconductor element including the oxide semiconductor film containing a small amount of impurities can be provided.

BEST MODE FOR CARRYING OUT THE INVENTION

An embodiment of the present invention will be described in detail below with reference to drawings. Note that the present invention is not limited to the following description and it will be easily understood by those skilled in the art that modes and details can be modified in various ways. In addition, the present invention is not construed as being limited to description of the embodiment.

Embodiment 1

Figure 1:
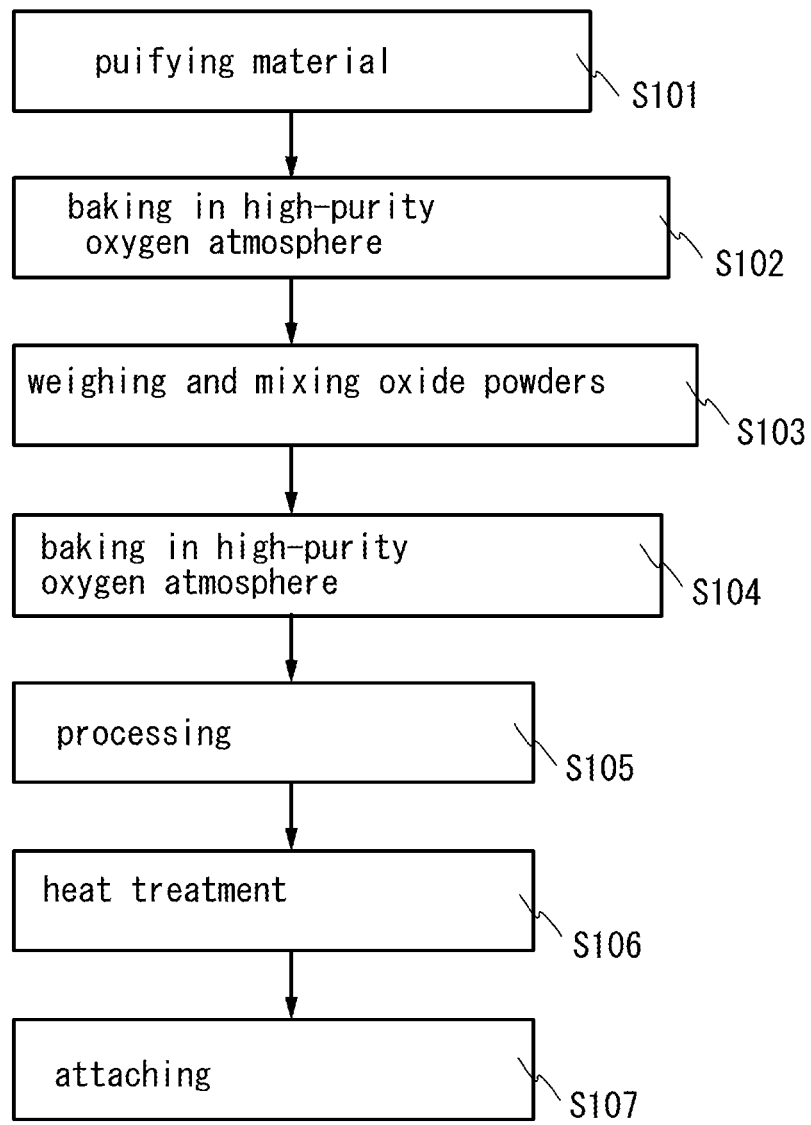
FIG. 1 is a flow chart illustrating a method for manufacturing a sputtering target.

In this embodiment, a method for manufacturing a sputtering target which is one embodiment of the present invention will be described with reference to FIG. 1. FIG. 1 is a flow chart illustrating an example of a method for manufacturing a sputtering target according to this embodiment.

First, plural kinds of single metals (Zn, In, Al, Sn, and the like) that are materials of the sputtering target are each purified by repeating distillation, sublimation, or recrystallization (S101). After that, purified metals are each processed into a powder form. Note that in the case of using Ga or Si as the material of the sputtering target, a single crystal is obtained by a zone melt method or a Czochralski method and then processing into a powder form is performed. Then, each of the sputtering target materials is baked in a high-purity oxygen atmosphere so as to be oxidized (S102). Subsequently, each of the oxide powders is weighed as appropriate, and the weighed oxide powders are mixed (S103).

The purity of the high-purity oxygen atmosphere is, for example, 6N (99.9999%) or higher, preferably 7N (99.99999%) or higher (i.e., the concentration of impurities is 1 ppm or lower, preferably 0.1 ppm or lower).

In this embodiment, a sputtering target for an In—Ga—Zn-based oxide semiconductor is to be manufactured. For example, $In_2O_3$, $Ga_2O_3$, and $ZnO$ are weighed so that the composition ratio of $In_2O_3$:$Ga_2O_3$:$ZnO$ is 1:1:1 [molar ratio].

As examples of the sputtering target for an oxide semiconductor which is manufactured in this embodiment, without being limited to a sputtering target for an In—Ga—Zn-based oxide semiconductor, the following can be given: a sputtering target for an In—Sn—Ga—Zn-based oxide semiconductor, a sputtering target for an In—Sn—Zn-based oxide semiconductor, a sputtering target for an In—Al—Zn-based oxide semiconductor, a sputtering target for a Sn—Ga—Zn-based oxide semiconductor, a sputtering target for an Al—Ga—Zn-based oxide semiconductor, a sputtering target for a Sn—Al—Zn-based oxide semiconductor, a sputtering target for an In—Zn-based oxide semiconductor, a sputtering target for a Sn—Zn-based oxide semiconductor, a sputtering target for an Al—Zn-based oxide semiconductor, a sputtering target for an In-based oxide semiconductor, a sputtering target for a Sn—based oxide semiconductor, a sputtering target for a Zn-based oxide semiconductor, and the like.

Next, the mixture is shaped into a predetermined shape and baked, whereby a sintered body of the metal oxide is obtained (S104). By baking the sputtering target material, hydrogen, moisture, hydrocarbon, and the like can be prevented from being mixed into the sputtering target. The baking can be performed in an inert gas atmosphere (a nitrogen atmosphere or a rare gas atmosphere), in vacuum, or in a high-pressure atmosphere, and further, may be performed with application of mechanical pressure. As a baking method, an atmospheric sintering method, a pressure sintering method, or the like can be used as appropriate. As the pressure sintering method, a hot pressing method, a hot isostatic pressing (HIP) method, a discharge plasma sintering method, or an impact method is preferably used. Although the maximum temperature at which baking is performed is selected depending on the sintering temperature of the sputtering target material, it is preferably set to approximately 1000° C. to 2000° C., or more preferably, 1200° C. to 1500° C. Although the holding time of the maximum temperature is selected depending on the sputtering target material, 0.5 hours to 3 hours is preferable.

Note that the filling rate of the sputtering target for an oxide semiconductor in this embodiment is preferably higher than or equal to 90% and lower than or equal to 100%, or more preferably, higher than or equal to 95% and lower than or equal to 99.9% inclusive.

Next, mechanical processing is performed in order to form a sputtering target having desired dimensions, a desired shape, and desired surface roughness (S105). As a processing means, for example, mechanical polishing, chemical mechanical polishing (CMP), or a combination of these can be used.

Then, in order to remove minute dust generated by the mechanical processing and components of a grinding solution, the sputtering target may be cleaned. Note that, in the case where the sputtering target is cleaned by ultrasonic cleaning in which the target is soaked in water or an organic solvent, cleaning with running water, or the like, it is preferable that heat treatment be subsequently performed for sufficiently reducing the concentration of hydrogen in the target or on a surface thereof.

Then, heat treatment is performed on the sputtering target (S106). The heat treatment is preferably performed in an inert gas atmosphere (a nitrogen atmosphere or a rare gas atmosphere). Although the temperature of the heat treatment differs depending on the sputtering target material, it is set to a temperature at which the sputtering target is not changed in property. Specifically, the temperature is higher than or equal to 150° C. and lower than or equal to 750° C., preferably, higher than or equal to 425° C. and lower than or equal to 750° C. Heating time is, specifically, 0.5 hours or longer, preferably, for an hour or longer. The heat treatment may be performed in vacuum or in a high-pressure atmosphere.

After that, the sputtering target is attached to a metal plate called a backing plate (S107). A backing plate has functions of cooling the sputtering target material and being a sputtering electrode and thus is preferably formed using copper, which is excellent in thermal conductivity and electric conductivity. Alternatively, titanium, a copper alloy, a stainless steel alloy, or the like can be used other than copper.

Figure 2A:
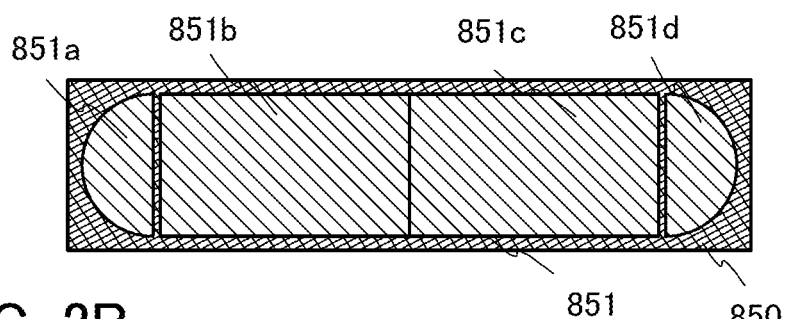
FIGS. 2A and 2B are top views illustrating a sputtering target.
Figure 2B:
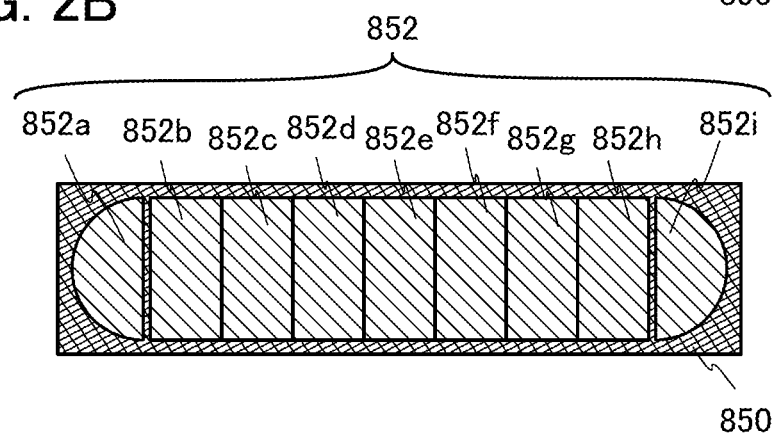

Further, at the time of attaching the sputtering target to the backing plate, the sputtering target may be divided and attached to one backing plate. FIGS. 2A and 2B illustrate examples in which the sputtering target is divided and attached (bonded) to one backing plate.

FIG. 2A illustrates an example in which a sputtering target 851 is divided into four pieces of sputtering targets 851a, 851b, 851c, and 851d and they are attached to a backing plate 850. FIG. 2B illustrates an example in which a sputtering target is divided to a larger number of sputtering targets; that is, a sputtering target 852 is divided into nine pieces of sputtering targets 852a, 852b, 852c, 852d, 852e, 852f, 852g, 852h, and 852i, and they are attached to the backing plate 850. Note that the number of pieces of divided sputtering targets and the shape of the target are not limited to the number and the shape in the case of FIG. 2A or FIG. 2B. When the sputtering target is divided, warpage of the sputtering target can be relaxed in the attachment of the sputtering target to the backing plate. In particular, when a film is formed over a large substrate, such divided sputtering targets can be suitably used for a sputtering target which is upsized in accordance with the size of the large substrate. Needless to say, one sputtering target may be attached to one backing plate.

It is preferable that the sputtering target which has been subjected to the heat treatment be transferred, stored, and the like in a high-purity oxygen gas atmosphere, a high-purity $N_2O$ gas atmosphere, or an ultra dry air (having a dew point of −40° C. or lower, preferably −60° C. or lower) atmosphere, in order to prevent entry of impurities such as moisture, hydrogen, or an alkali metal. The target may be covered with a protective material formed of a material with low water permeability such as a stainless steel alloy, and the above gas may be introduced into a gap between the protective material and the target. It is preferable that the oxygen gas and the $N_2O$ gas do not contain water, hydrogen, and the like. Alternatively, the purity of an oxygen gas or a $N_2O$ gas is preferably 6N (99.9999%) or higher, more preferably 7N (99.99999%) or higher (that is, the impurity concentration in the oxygen gas or the $N_2O$ gas is 1 ppm or lower, preferably 0.1 ppm or lower).

Through the above process, the sputtering target described in this embodiment can be manufactured. The sputtering target in this embodiment can contain a small amount of impurities by using the materials each of which is purified to have high purity in the manufacturing process. Further, the concentration of impurities contained in the oxide semiconductor film which is formed using the target can also be reduced.

The above-described manufacture of the sputtering target is preferably conducted in an inert gas atmosphere (a nitrogen atmosphere or a rare gas atmosphere) without exposure to air.

Similarly, the sputtering target is set in a sputtering apparatus in an inert gas atmosphere (a nitrogen atmosphere or a rare gas atmosphere) without exposure to air. Accordingly, hydrogen, moisture, an alkali metal, or the like can be prevented from attaching to the sputtering target.

In addition, after the sputtering target is set in the sputtering apparatus, dehydrogenation treatment is preferably performed to remove hydrogen which remains on a surface of or inside the target material. As the dehydrogenation treatment, a method in which the inside of the film formation chamber is heated to 200° C. to 600° C. under reduced pressure, a method in which introduction and removal of nitrogen or an inert gas are repeated while the inside of the film formation chamber is heated, and the like can be given.

Moreover, in the sputtering apparatus in which the sputtering target is set, it is preferable that the leakage rate be set to $1 \times 10^{-10}$ Pa·m³/sec or lower, entry of water as an impurity be reduced with the use of, specifically, a cryopump as an evacuation unit, and counter flow be also prevented.

With reference to FIGS. 3A to 3E, an example will be described below in which a transistor is manufactured with the use of a sputtering apparatus in which a sputtering target manufactured in the above-described process is set. Also in a manufacturing process of the transistor, it is preferable that impurities such as a compound containing a hydrogen atom typified by $H_2O$, a compound containing an alkali metal, and a compound containing an alkaline earth metal be prevented from entering an oxide semiconductor film formed in the sputtering apparatus.

First, a conductive film is formed over a substrate 100 having an insulating surface, and then, a gate electrode layer 112 is formed through a first photolithography process and an etching step.

An insulating film serving as a base film may be formed between the substrate 100 and the gate electrode layer 112; in this embodiment, a base film 101 is provided. The base film 101 has a function of preventing diffusion of impurity elements (e.g., Na) from the substrate 100 and can be formed from a film selected from a silicon oxide film, a silicon oxynitride film, a silicon nitride film, a hafnium oxide film, an aluminum oxide film, a gallium oxide film, and a gallium aluminum oxide ($Ga_xAl_{2-x}O_{3+y}$ (where x is greater than or equal to 0 and less than or equal to 2, and y is greater than 0 and less than 1)) film. By provision of the base film 101, impurity elements (e.g., Na) from the substrate 100 can be prevented from diffusing into an oxide semiconductor film that is formed later. The structure of the base film is not limited to a single-layer structure, and may be a layered structure of a plurality of the above films.

Figure 3A:
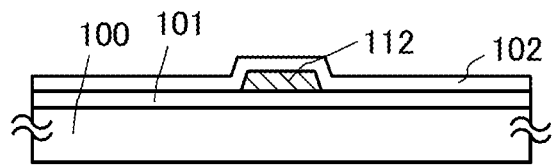
FIGS. 3A to 3E are cross-sectional views illustrating an example of a method for manufacturing a transistor.
Figure 3B:
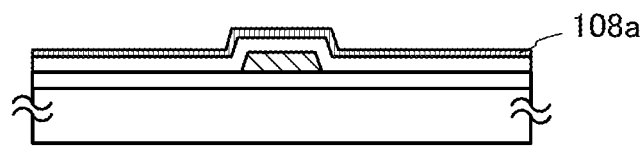
Figure 3C:
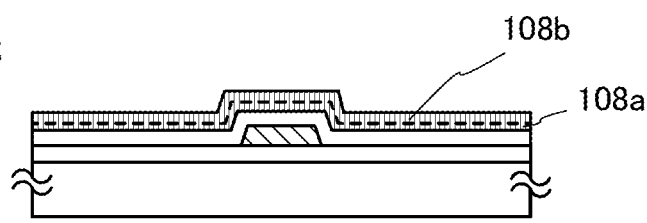

Then, a gate insulating layer 102 is formed over the gate electrode layer 112 by a sputtering method or a PCVD method (see FIG. 3A). Also at the time of formation of the gate insulating layer 102, it is preferable that entry of impurities such as a compound containing an alkali metal and a compound containing an alkaline earth metal be prevented, and the gate insulating layer 102 is formed without exposure to air after the base film 101 is formed.

Then, after the gate insulating layer 102 is formed, a first oxide semiconductor film having a thickness of greater than or equal to 1 nm and less than or equal to 10 nm is formed over the gate insulating layer 102 by a sputtering method without exposure to air. In this embodiment, the first oxide semiconductor film is formed to a thickness of 5 nm in an oxygen atmosphere, an argon atmosphere, or a mixed atmosphere of argon and oxygen under conditions where a target for an oxide semiconductor (a target for an In—Ga—Zn-based oxide semiconductor containing $In_2O_3$, $Ga_2O_3$, and ZnO at 1:1:2 [molar ratio]) is used, the distance between the substrate and the target is 170 mm, the substrate temperature is 250° C., the pressure is 0.4 Pa, and the direct current (DC) power source is 0.5 kW. The target for an oxide semiconductor includes a sintered body of at least one oxide selected from zinc oxide, aluminum oxide, gallium oxide, indium oxide, and tin oxide, and the concentration of each of alkali metals contained in the sintered body by SIMS is $5\times10^{16}$ $cm^{-3}$ or lower. In addition, the concentration of Na contained in the sintered body by SIMS is $5\times10^{16}$ $cm^{-3}$ or lower, preferably $1\times10^{16}$ $cm^{-3}$ or lower, further preferably $1\times10^{15}$ $cm^{-3}$ or lower. In addition, the concentration of Li contained in the sintered body by SIMS is $5\times10^{15}$ $cm^{-3}$ or lower, preferably $1\times10^{15}$ $cm^{-3}$ or lower. In addition, the concentration of K contained in the sintered body by SIMS is $5\times10^{15}$ $cm^{-3}$ or lower, preferably $1\times10^{15}$ $cm^{-3}$ or lower.

After the first oxide semiconductor film is formed, without exposure to air, first heat treatment is performed by setting an atmosphere where the substrate is placed to a nitrogen atmosphere or dry air. The temperature of the first heat treatment is higher than or equal to 400° C. and lower than or equal to 750° C. In addition, heating time of the first heat treatment is longer than or equal to one minute and shorter than or equal to 24 hours. By the first heat treatment, a first crystalline oxide semiconductor film 108a is formed (see FIG. 3B).

Subsequently, after the first heat treatment, without exposure to air, a second oxide semiconductor film having a thickness greater than 10 nm is formed over the first crystalline oxide semiconductor film 108a by a sputtering method. In this embodiment, the second oxide semiconductor film is formed to a thickness of 25 nm in an oxygen atmosphere, an argon atmosphere, or a mixed atmosphere of argon and oxygen under conditions where a target for an oxide semiconductor (a target for an In—Ga—Zn-based oxide semiconductor containing $In_2O_3$, $Ga_2O_3$, and ZnO at 1:1:2 [molar ratio]) is used, the distance between the substrate and the target is 170 mm, the substrate temperature is 400° C., the pressure is 0.4 Pa, and the direct current (DC) power source is 0.5 kW. The target for an oxide semiconductor includes a sintered body of at least one oxide selected from zinc oxide, aluminum oxide, gallium oxide, indium oxide, and tin oxide, and the concentration of each of alkali metals contained in the sintered body by SIMS is $5\times10^{16}$ $cm^{-3}$ or lower. In addition, the concentration of Na contained in the sintered body by SIMS is $5\times10^{16}$ $cm^{-3}$ or lower, preferably $1\times10^{16}$ $cm^{-3}$ or lower, further preferably $1\times10^{15}$ $cm^{-3}$ or lower. In addition, the concentration of Li contained in the sintered body by SIMS is $5\times10^{15}$ $cm^{-3}$ or lower, preferably $1\times10^{15}$ $cm^{-3}$ or lower. In addition, the concentration of K contained in the sintered body by SIMS is $5\times10^{15}$ $cm^{-3}$ or lower, preferably $1\times10^{15}$ $cm^{-3}$ or lower.

Note that it is preferable that entry of impurities such as a compound containing a hydrogen atom typified by $H_2O$, a compound containing an alkali metal, and a compound containing an alkaline earth metal be prevented at the time of deposition of the first oxide semiconductor film and the second oxide semiconductor film. Specifically, the distance (also called a TS distance) between the substrate and the target is made large, in which case a high-mass impurity element is eliminated and entry thereof at the time of deposition is reduced; alternatively, the film formation chamber is set to a high vacuum state, in which case $H_2O$ or the like which is attached to the substrate is evaporated from a surface on which the film is formed. Further, it is preferable that impurities such as a compound containing a hydrogen atom typified by $H_2O$, a compound containing an alkali metal, and a compound containing an alkaline earth metal be prevented from entering the oxide semiconductor film by setting the substrate temperature at the time of deposition to higher than or equal to 250° C. and lower than or equal to 450° C.

After the second oxide semiconductor film is formed, without exposure to air, second heat treatment is performed by setting an atmosphere where the substrate is placed to a nitrogen atmosphere or dry air. The temperature of the second heat treatment is higher than or equal to 400° C. and lower than or equal to 750° C. In addition, heating time of the second heat treatment is longer than or equal to one minute and shorter than or equal to 24 hours. By the second heat treatment, a second crystalline oxide semiconductor film 108b is formed (see FIG. 3C).

Figure 3D:
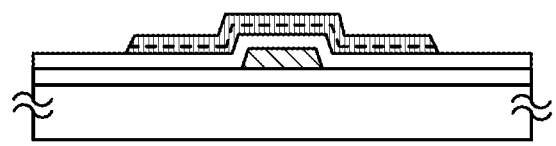

Then, an oxide semiconductor stack of the first crystalline oxide semiconductor film 108a and the second crystalline oxide semiconductor film 108b is processed into an island-shaped oxide semiconductor stack (see FIG. 3D).

The oxide semiconductor stack can be processed by etching after a mask having a desired shape is formed over the oxide semiconductor stack. The above mask can be formed by a method such as photolithography. Alternatively, a method such as an inkjet method may be used to form the mask.

For the etching of the oxide semiconductor stack, either wet etching or dry etching may be employed. It is needless to say that these may be combined.

After that, a conductive film for forming a source electrode layer and a drain electrode layer (including a wiring formed in the same layer as the source electrode layer and the drain electrode layer) is formed over the oxide semiconductor stack and is processed to form a source electrode layer 104a and a drain electrode layer 104b.

Figure 3E:
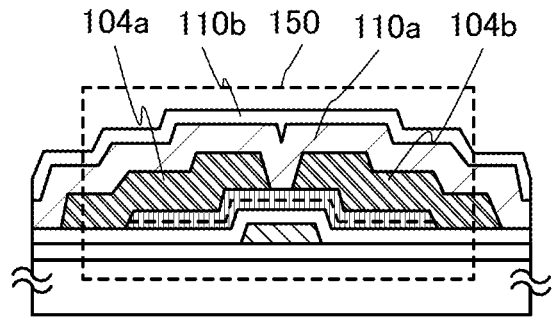

Next, an insulating film 110a and an insulating film 110b which cover the oxide semiconductor stack, the source electrode layer 104a, and the drain electrode layer 104b are formed (see FIG. 3E). The insulating film 110a is formed using an oxide insulating material, and after deposition, third heat treatment is preferably performed. By the third heat treatment, oxygen is supplied from the insulating film 110a to the oxide semiconductor stack. The third heat treatment is performed in an inert atmosphere, an oxygen atmosphere, a mixed atmosphere of oxygen and nitrogen, at a temperature higher than or equal to 200° C. and lower than or equal to 400° C., preferably higher than or equal to 250° C. and lower than or equal to 320° C. In addition, heating time of the third heat treatment is longer than or equal to one minute and shorter than or equal to 24 hours.

Through the above process, a bottom-gate transistor 150 is formed.

The transistor 150 includes the base film 101, the gate electrode layer 112, the gate insulating layer 102, the oxide semiconductor stack including a channel formation region, the source electrode layer 104a, the drain electrode layer 104b, and the insulating film 110a, which are formed over the substrate 100 having the insulating surface. The source electrode layer 104a and the drain electrode layer 104b are provided to cover the oxide semiconductor stack. A region functioning as the channel formation region is part of the oxide semiconductor stack which overlaps with the gate electrode layer 112 with the gate insulating layer 102 interposed therebetween.

In a semiconductor layer (which refers to the above oxide semiconductor stack) including the channel formation region of the transistor 150 which is illustrated in FIG. 3E, the concentration of Na observed by SIMS is $5\times10^{16}$ cm$^{-3}$ or lower, preferably $1\times10^{16}$ cm$^{-3}$ or lower, further preferably $1\times10^{15}$ cm$^{-3}$ or lower. In the semiconductor layer including the channel formation region of the transistor 150, the concentration of Li observed by SIMS is $5\times10^{15}$ cm$^{-3}$ or lower, preferably $1\times10^{15}$ cm$^{-3}$ or lower. In the semiconductor layer including the channel formation region of the transistor 150, the concentration of K observed by SIMS is $5\times10^{15}$ cm$^{-3}$ or lower, preferably $1\times10^{15}$ cm$^{-3}$ or lower.

In the semiconductor layer including the channel formation region of the transistor 150 illustrated in FIG. 3E, it is preferable that the concentration of hydrogen observed by SIMS be $5\times10^{19}$ cm$^{-3}$ or lower, specifically $5\times10^{18}$ cm$^{-3}$ or lower.

The semiconductor layer including the channel formation region of in the transistor 150 illustrated in FIG. 3E is a stack of the first crystalline oxide semiconductor film 108a and the second crystalline oxide semiconductor film 108b. The first crystalline oxide semiconductor film 108a and the second crystalline oxide semiconductor film 108b are c-axis aligned. Note that the first crystalline oxide semiconductor film 108a and the second crystalline oxide semiconductor film 108b comprise an oxide including crystals with c-axis alignment (also referred to as C-Axis Aligned Crystal (CAAC)), which has neither a single crystal structure nor an amorphous structure. The first crystalline oxide semiconductor film 108a and the second crystalline oxide semiconductor film 108b partly include a crystal grain boundary and are apparently different from an amorphous oxide semiconductor film.

In the case of the transistor including a stack of a first crystalline oxide semiconductor film and a second crystalline oxide semiconductor film, the amount of change in threshold voltage of the transistor between before and after a bias-temperature (BT) stress test can be reduced even when the transistor is irradiated with light; thus, such a transistor has stable electric characteristics.

Note that although an example of a bottom-gate transistor is illustrated in FIGS. 3A to 3E, the present invention is not limited thereto and a top-gate transistor can also be manufactured, for example.

REFERENCE NUMERALS

100: substrate, 101: base film, 102: gate insulating layer, 104a: source electrode layer, 104b: drain electrode layer, 108a: first crystalline oxide semiconductor film, 108b: second crystalline oxide semiconductor film, 110a: insulating film, 110b: insulating film, 112: gate electrode layer, 150: transistor, 850: backing plate, 851: sputtering target, 851a: sputtering target, 851b: sputtering target, 851c: sputtering target, 851d: sputtering target, 852: sputtering target, 852a: sputtering target, 852b: sputtering target, 852c: sputtering target, 852d: sputtering target, 852e: sputtering target, 852f: sputtering target, 852g: sputtering target, 852h: sputtering target, and 852i: sputtering target This application is based on Japanese Patent Application serial no. 2010-197509 filed with Japan Patent Office on Sep. 3, 2010, the entire contents of which are hereby incorporated by reference.

The invention claimed is:

1. A method for manufacturing a semiconductor device, the method comprising the steps of:
   forming a gate electrode;
   forming a gate insulating layer;
   forming an oxide semiconductor film by a sputtering method using a sputtering target; and
   performing a heat treatment on the oxide semiconductor film,
   wherein the heat treatment is performed in an atmosphere containing nitrogen,
   wherein the sputtering target comprises a sintered body comprising zinc oxide and indium oxide,
   wherein the gate electrode and the oxide semiconductor film overlap with each other with the gate insulating layer interposed therebetween,
   wherein the oxide semiconductor film includes crystals with c-axis alignment after the heat treatment, and
   wherein concentration of each of alkali metals contained in the sintered body which is measured by SIMS is $5\times10^{16}$ cm$^{-3}$ or lower.

2. The method for manufacturing a semiconductor device according to claim 1,
   wherein the gate electrode, the gate insulating layer and the oxide semiconductor film are provided on a substrate, and
   wherein the substrate is heated in the step of forming the oxide semiconductor film.

3. The method for manufacturing a semiconductor device according to claim 1, wherein the gate insulating layer is over the gate electrode and the oxide semiconductor film is over the gate insulating layer.

4. The method for manufacturing a semiconductor device according to claim 1, wherein the sintered body further comprises gallium oxide.

5. The method according to claim 1, wherein concentration of hydrogen contained in the oxide semiconductor film which is measured by SIMS is $1\times10^{19}$ cm$^{-3}$ or lower.

6. A method for manufacturing a semiconductor device, the method comprising the steps of:
   forming a gate electrode;
   forming a gate insulating layer;
   forming an oxide semiconductor film by a sputtering method using a sputtering target;
   performing a first heat treatment on the oxide semiconductor film;
   forming an oxide insulating film in contact with the oxide semiconductor film; and
   performing a second heat treatment on the oxide semiconductor film and the oxide insulating film,
   wherein the sputtering target comprises a sintered body comprising zinc oxide and indium oxide,
   wherein the gate electrode and the oxide semiconductor film overlap with each other with the gate insulating layer interposed therebetween,
   wherein the oxide semiconductor film includes crystals with c-axis alignment after the first heat treatment, and
   wherein concentration of each of alkali metals contained in the sintered body which is measured by SIMS is $5\times10^{16}$ cm$^{-3}$ or lower.

7. The method for manufacturing a semiconductor device according to claim 6, wherein the gate electrode, the gate insulating layer and the oxide semiconductor film are provided on a substrate, and wherein the substrate is heated in the step of forming the oxide semiconductor film.

8. The method for manufacturing a semiconductor device according to claim 6, wherein the gate insulating layer is over the gate electrode and the oxide semiconductor film is over the gate insulating layer.

9. The method for manufacturing a semiconductor device according to claim 6, wherein oxygen is supplied from the oxide insulating film to the oxide semiconductor film during the second heat treatment.

10. The method for manufacturing a semiconductor device according to claim 6, wherein the sintered body further comprises gallium oxide.

11. The method according to claim 6, wherein the first heat treatment is performed in an atmosphere containing nitrogen.

12. The method according to claim 6, wherein concentration of hydrogen contained in the oxide semiconductor film which is measured by SIMS is $1 \times 10^{19}$ cm$^{-3}$ or lower.

13. A method for manufacturing a semiconductor device, the method comprising the steps of:
    forming a gate electrode;
    forming a gate insulating layer;
    forming a first oxide semiconductor film by a sputtering method using a first sputtering target;
    forming a second oxide semiconductor film over the first oxide semiconductor film by a sputtering method using a second sputtering target; and
    performing a heat treatment on the first oxide semiconductor film and the second oxide semiconductor film,
    wherein each of the first sputtering target and the second sputtering target comprises a sintered body comprising zinc oxide and indium oxide,
    wherein the gate electrode and the first oxide semiconductor film overlap with each other with the gate insulating layer interposed therebetween,
    wherein each of the first oxide semiconductor film and the second oxide semiconductor film includes crystals with c-axis alignment after the heat treatment, and
    wherein concentration of each of alkali metals contained in the sintered body which is measured by SIMS is $5 \times 10^{16}$ cm$^{-3}$ or lower.

14. The method for manufacturing a semiconductor device according to claim 13,
    wherein the gate electrode, the gate insulating layer, the first oxide semiconductor film and the second oxide semiconductor film are provided on a substrate, and
    wherein the substrate is heated in each of the steps of forming the first oxide semiconductor film and the second oxide semiconductor film.

15. The method for manufacturing a semiconductor device according to claim 13,
    wherein the gate insulating layer is over the gate electrode, and
    wherein the first oxide semiconductor film is over the gate insulating layer.

16. The method for manufacturing a semiconductor device according to claim 13, further comprising the steps of:
    forming an oxide insulating film over and in contact with the second oxide semiconductor film; and
    performing a heat treatment on the first oxide semiconductor film, the second oxide semiconductor film and the oxide insulating film.

17. The method for manufacturing a semiconductor device according to claim 13, wherein the sintered body further comprises gallium oxide.

18. The method according to claim 13, wherein the heat treatment is performed in an atmosphere containing nitrogen.

19. The method according to claim 13, wherein concentration of hydrogen contained in each of the first oxide semiconductor film and the second oxide semiconductor film which is measured by SIMS is $1 \times 10^{19}$ cm$^{-3}$ or lower.

* * * * *